(12) United States Patent
Ohki et al.

(10) Patent No.: US 7,653,317 B2
(45) Date of Patent: Jan. 26, 2010

(54) SEMICONDUCTOR LASER DEVICE

(75) Inventors: Yutaka Ohki, Tokyo (JP); Naoki Tsukiji, Tokyo (JP); Hidehiro Taniguchi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 114 days.

(21) Appl. No.: 11/384,559

(22) Filed: Mar. 21, 2006

(65) Prior Publication Data
US 2006/0176922 A1  Aug. 10, 2006

Related U.S. Application Data

(63) Continuation of application No. PCT/JP2004/014098, filed on Sep. 27, 2004.

(30) Foreign Application Priority Data
Sep. 26, 2003  (JP)  ............................. 2003-335459

(51) Int. Cl.
*H04B 10/04* (2006.01)
(52) U.S. Cl. .................. 398/192; 398/182; 398/183; 398/186; 398/194; 398/196; 398/200; 398/201; 372/43.01; 372/97; 372/6; 372/29.02; 372/102; 372/38.01; 372/96; 372/105; 372/108; 385/24; 385/37; 385/90; 385/92; 385/93
(58) Field of Classification Search .......... 398/79, 398/82, 84, 85, 87, 91, 158, 92, 160, 94, 398/95, 25, 37, 28, 38, 173, 177, 178, 180, 398/192, 182, 193, 194, 183, 186, 196, 197, 398/198, 200, 201; 385/24, 37, 88, 89, 90, 385/91, 92, 93; 359/341, 337, 341.1, 341.3, 359/334; 372/6, 97, 29.02, 3, 108, 96.32, 372/43, 44, 45, 96, 102, 105, 32, 98, 92, 372/38.01, 43.01, 50
See application file for complete search history.

(56) References Cited

U.S. PATENT DOCUMENTS

| | | | |
|---|---|---|---|
| 4,528,670 A | | 7/1985 | Burrus et al. |
| 6,163,554 A | * | 12/2000 | Chang et al. ................ 372/6 |
| 6,320,885 B1 | * | 11/2001 | Kawai et al. ................ 372/6 |
| 6,524,016 B1 | | 2/2003 | Ohki et al. |
| 6,525,872 B1 | * | 2/2003 | Ziari et al. ............... 359/341.3 |
| 6,549,329 B2 | * | 4/2003 | Vail et al. .................. 359/334 |
| 6,778,583 B2 | * | 8/2004 | Crawford et al. ............. 372/97 |
| 2004/0052484 A1 | | 3/2004 | Broeng et al. |
| 2005/0123012 A1 | | 6/2005 | Hayamizu et al. |

FOREIGN PATENT DOCUMENTS

CA  1 261 127  9/1989

(Continued)

OTHER PUBLICATIONS

R. McGowan & D. Crawford, ThGG42, "Dual Bragg Grating Frequency Stabilization of a 980 nm Diode Laser", OFC2002 Technical Digest, pp. 671-672, Mar. 17-22, 2002.

*Primary Examiner*—Hanh Phan
(74) *Attorney, Agent, or Firm*—Oblon, Spivak, McClelland, Maier & Neustadt, L.L.P.

(57) ABSTRACT

A first light feedback element is arranged at an optical distance L1 from a front facet of a semiconductor laser from which an output light is emitted on an optical path of the output light. An i-th light feedback element is arranged at an optical distance Li from the front facet on the optical path of the output light, where i=2 to n, n is a positive integer not less than 2, and Li>L1. L1 and Li satisfies $((M-1)+0.01)<(Li/L1)<(M-0.01)$, where M is a positive integer not less than 2, satisfying $(M-1)<(Li/L1)\leq M$.

21 Claims, 15 Drawing Sheets

FOREIGN PATENT DOCUMENTS

| | | |
|---|---|---|
| GB | 2 134 099 | 8/1984 |
| JP | 51-109919 | 9/1976 |
| JP | 59-163886 | 9/1984 |
| JP | 10-95628 | 4/1998 |
| JP | 2001-160652 | 6/2001 |
| JP | 2001-235649 | 8/2001 |
| JP | 2002-055242 | 2/2002 |
| JP | 2002-97034 | 4/2002 |
| JP | 2002-211941 | 7/2002 |
| JP | 2003-206148 | 7/2003 |
| JP | 2004-191947 | 7/2004 |
| JP | 2004-533398 | 11/2004 |
| JP | 2005-289769 | 10/2005 |

* cited by examiner

FIG.17
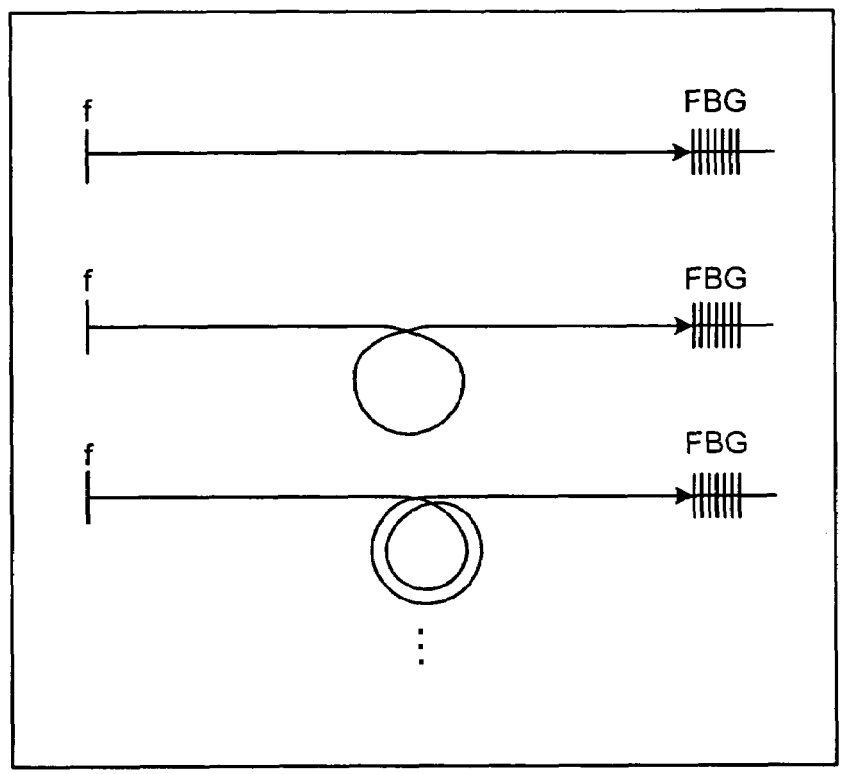
×
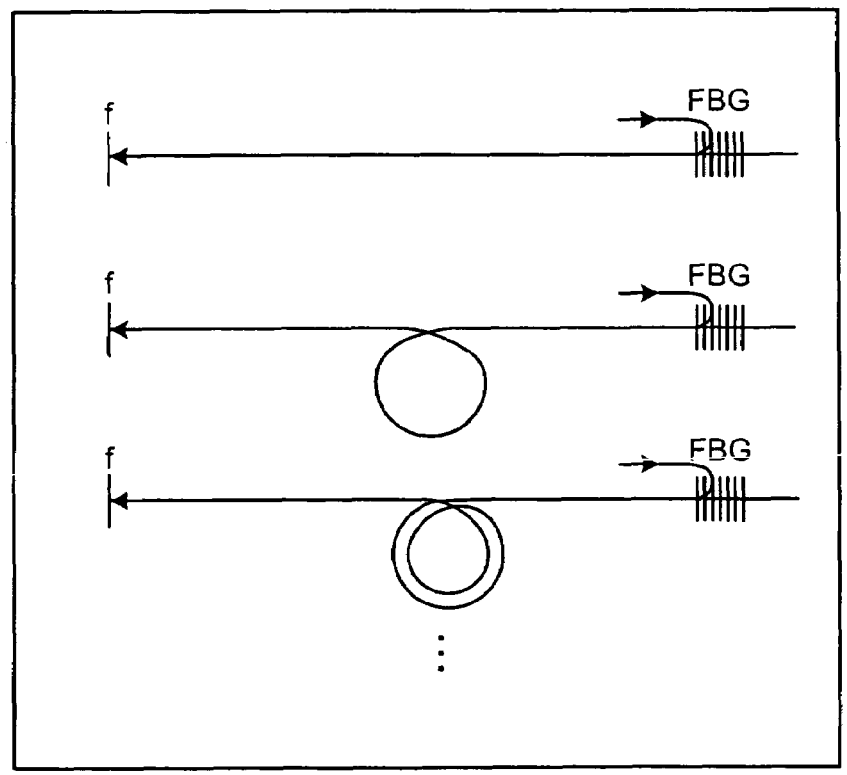

SEMICONDUCTOR LASER DEVICE

CROSS-REFERENCE TO RELATED APPLICATIONS

This application is a continuation of PCT/JP2004/014098 filed on Sep. 27, 2004, the entire content of which are incorporated herein by reference.

BACKGROUND OF THE INVENTION

1. Field of the Invention

The present invention relates to a semiconductor laser device.

2. Description of the Related Art

In the field of optical communications, an optical transmission system using a wavelength-division-multiplexing (WDM) system has been developed to achieve high-capacity transmission. As a pump light source for an optical fiber amplifier used in the WDM system, there is an increasing demand for a pump semiconductor laser in 1480 nm or 980 nm band. It is known that a technology of providing a fiber Bragg grating (FBG) in an optical fiber is very effective in stabilization of the wavelength of a laser light emitted from a semiconductor laser device.

There has been a conventional problem in the semiconductor laser device using the FBG, of temporal instability due to fluctuation of the output power of the emitted laser light.

As a method of mitigating this problem, a method of providing an extra FBG of equal half width of a reflectance-wavelength spectrum and of equal reflectance to those of the other FBG in the optical fiber is proposed. In McGowan and D. Crawford, ThGG42 "Dual Bragg Grating Frequency Stabilization of a 980 nm Diode Laser", OFC2002 Technical Digest, pp. 671-672, in particular, conditions for obtaining a stable laser output are studied by variously changing an interval between FBGs or a distance from a semiconductor laser to one of the FBGs, which is closer to the semiconductor laser.

If a light output is unstable in a semiconductor laser device using the FBG, an oscillation spectrum is observed as a phenomenon such that the oscillation longitudinal mode of the semiconductor laser temporally switches between a single-mode state and a multi-mode state. To stabilize the light output, it is important to always maintain multi-mode oscillation. Such an oscillation state is called "coherence collapse". The technology disclosed in the above literature is effective to obtain such a coherence collapse state. However, even if the multi-mode oscillation is maintained, the light output still sometimes fluctuates temporally.

Although temporal fluctuations of the light output tend to occur around a threshold current of the semiconductor laser in general, the stabilization of the light output is required even in a current range closer to the threshold current because of recent improvement in performance of optical fiber amplifiers.

SUMMARY OF THE INVENTION

It is an object of the present invention to solve the problems in the conventional technology.

A semiconductor laser device according to one aspect of the present invention includes a semiconductor laser having a front facet from which an output light is emitted; a first light feedback element arranged at an optical distance $L1$ from the front facet on an optical path of the output light, the first light feedback portion having a predetermined reflection center wavelength and configured to feed a part of the output light back to the semiconductor laser; and an i-th light feedback element each arranged at an optical distance $Li$ from the front facet on the optical path of the output light (where $i=2$ to $n$, $n$ is a positive integer not less than 2, and $Li>L1$), the i-th light feedback element each having a reflection center wavelength substantially equal to the reflection center wavelength of the first light feedback element and configured to feed a part of the output light back to the semiconductor laser. $L1$ and $Li$ satisfies $((M-1)+0.01)<(Li/L1)<(M-0.01)$, where $M$ is a positive integer not less than 2, satisfying $(M-1)<(Li/L1) \leq M$.

A semiconductor laser device according to another aspect of the present invention includes a semiconductor laser having a front facet from which an output light is emitted; a first light feedback element arranged at an optical distance $L1$ from the front facet on an optical path of the output light, the first light feedback element having a predetermined reflection center wavelength and configured to feed a part of the output light back to the semiconductor laser; and an i-th light feedback element each arranged at an optical distance $Li$ from the front facet on the optical path of the output light (where $i=2$ to $n$, $n$ is a positive integer not less than 2, and $Li>L1$), the i-th light feedback element each having a reflection center wavelength substantially equal to the reflection center wavelength of the first light feedback element and configured to feed a part of the output light back to the semiconductor laser. $L1$ and $Li$ satisfies either one of $(Li/L1)<(p/q-0.01)$ and $(Li/L1)>(p/q+0.01)$ for all combinations of relatively prime integers $p$ and $q$ selected to satisfy $(p+q) \leq 5$ and $p>q$.

A semiconductor laser device according to still another aspect of the present invention includes a semiconductor laser having a front facet from which an output light is emitted; a first light feedback element arranged at an optical distance $L1$ from the front facet on an optical path of the output light, the first light feedback element having a predetermined reflection center wavelength and configured to feed a part of the output light back to the semiconductor laser; and an i-th light feedback element each arranged at an optical distance $Li$ from the front facet on the optical path of the output light (where $i=2$ to $n$, $n$ is a positive integer not less than 2, and $Li>L1$), the i-th light feedback element each having a reflection center wavelength substantially equal to the reflection center wavelength of the first light feedback element and configured to feed a part of the output light back to the semiconductor laser. The optical path includes a pre-stage optical path to which the output light emitted from the semiconductor laser is input; and a j-th branch optical path (where $j=1$ to $m$, and $m$ is a positive integer not less than 2) into which the pre-stage optical path is branched. The first light feedback element and the i-th light feedback element ($i=2$ to $n$) are arranged on either one of the pre-stage optical path and the j-th branch optical path ($j=1$ to $m$).

A semiconductor laser device according to still another aspect of the present invention includes a semiconductor laser having a front facet from which an output light is emitted; a first light feedback element arranged at an optical distance $L1$ from the front facet on an optical path of the output light, the first light feedback element having a predetermined reflection center wavelength and configured to feed a part of the output light back to the semiconductor laser; and an i-th light feedback element each arranged at an optical distance $Li$ from the front facet on the optical path of the output light (where $i=2$ to $n$, $n$ is a positive integer not less than 2, and $Li>L1$), the i-th light feedback element each having a reflection center wavelength substantially equal to the reflection center wavelength of the first light feedback element and configured to feed a part of the output light back to the semiconductor laser. Li/L1 is not less than 4.01.

A semiconductor laser device according to still another aspect of the present invention includes a semiconductor laser having a front facet from which an output light is emitted; a pre-stage optical fiber to which the output light emitted from the semiconductor laser is input; a bidirectional optical coupler that has a predetermined branching ratio, one input port of the bidirectional optical coupler being connected with an end of the pre-stage optical fiber; an output optical fiber connected to one output port of the bidirectional optical coupler; and a fiber grating formed in the output optical fiber and having a predetermined reflection center wavelength. Another input port of the bidirectional optical coupler is optically coupled with another output port of the bidirectional optical coupler.

A method of stabilizing an output light from a semiconductor laser, according to still another aspect of the present invention, includes feeding wavelength-selected laser light back to the semiconductor laser by arranging a light feedback element on an optical path of the laser light; and splitting the laser light propagating through the optical path at a first point between the light feedback element and the semiconductor laser and combining a split laser light with the laser light propagating through the optical path at a second point between the first point and the semiconductor laser by arranging a loop optical path connecting the first point and the second point.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 17 is a diagram showing light path patterns of light reflected by FBG.

DETAILED DESCRIPTION OF THE PREFERRED EMBODIMENTS

Exemplary embodiments of the present invention are explained in detail below with reference to the accompanying drawings. It should be noted that the present invention is not limited by the embodiments.

Figure 1:
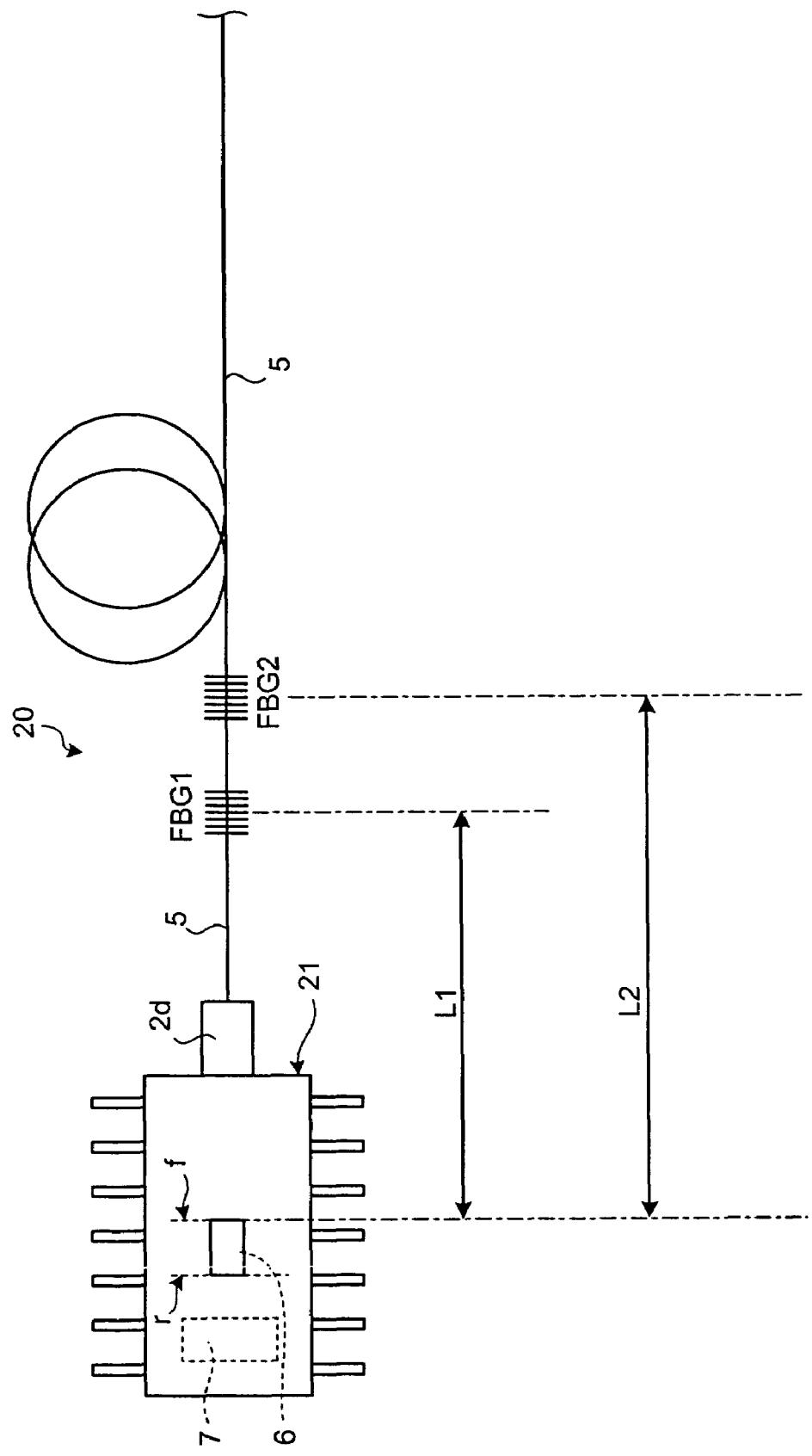
FIG. 1 is a schematic diagram of a semiconductor laser device according to a first embodiment of the present invention.

FIG. 1 is a schematic diagram of a semiconductor laser device 20 according to a first embodiment of the present invention. The semiconductor laser device 20 includes a package 21, an optical fiber 5, a semiconductor laser 6, and a photodiode 7, etc. An FBG1 and an FBG2 serving as light feedback elements are formed outside the package 21.

Figure 2:
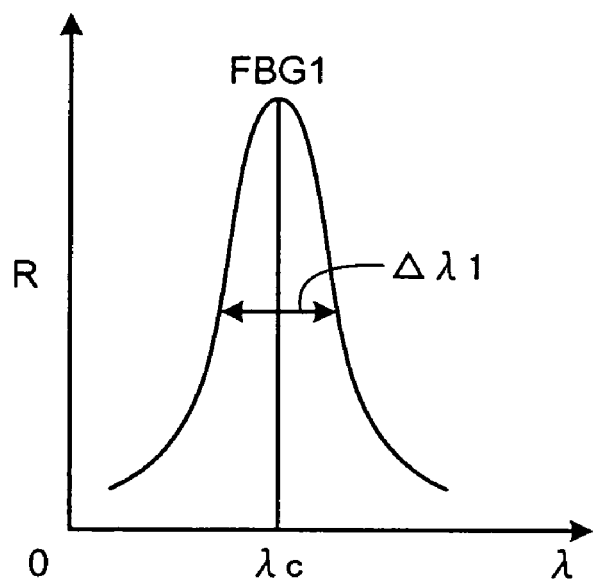
FIG. 2 is a graph of a reflectance spectrum of FBG1 shown in FIG. 1.
Figure 3:
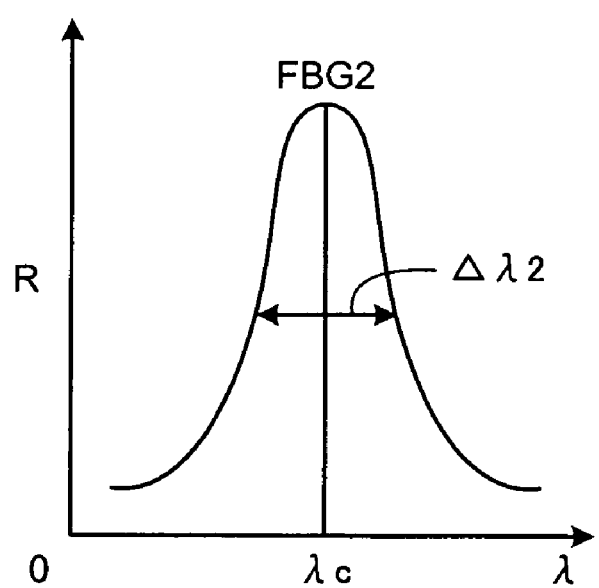
FIG. 3 is a graph of a reflectance spectrum of FBG2 shown in FIG. 1.

FIGS. 2 and 3 are reflectance spectra with respect to wavelength $\lambda$ of the FBG1 and the FBG2, respectively. The FBG1 and the FBG2 have reflection center wavelengths $\lambda c$ substantially equal to each other. The reflection center wavelengths are not necessarily completely equal to each other, but a difference may preferably be equal to within 2 nm, and more preferably, within 0.5 nm. Each peak value of the reflectance R of the FBG1 and the FBG2 is 1% to 10%, and more preferably, 2% to 4%. Actually, it is important that the FBG2 has a non-zero value of reflectance at the reflection center wavelength of the FBG1. Preferably, the non-zero value of reflectance is not less than 0.1%. Furthermore, half widths $\Delta\lambda 1$ and $\Delta\lambda 2$ of the reflection spectra of the FBG1 and the FBG2 are preferably 1 nm to 3 nm.

Positions of the FBG1 and the FBG2 are set respectively so that a value of L2/L1, where L1 and L2 are optical distances between the semiconductor laser 6 and the FBG1 and L2, respectively, does not fall within a range of N−0.01 to N+0.01, where N is an integer not less than 2. Preferably, the value of L2/L1 does not fall within a range of N−0.05 to N+0.05. It is noted that L1 and L2 indicate optical distances between a front facet f of the semiconductor laser, i.e. a facet from which a laser beam is emitted, and center positions of the FBG1 and the FBG2, respectively. The optical distance is expressed by a product of a refractive index and a length of an optical path. Typically, L1 is about tens of cm to about 1 m, with a certain degree of margin.

A birefringent fiber, as well as a single-mode fiber, may be used as the optical fiber 5. The birefringent fiber may have a core applied with asymmetric stress by stress applying portions, such as a polarization-maintaining and absorption-reducing (PANDA™) fiber with stress applying portions of circular cross section, a bow-tie fiber with stress applying portions of fan-shaped cross section, and an elliptic jacket fiber with stress applying portions of elliptic cross section.

condition. In Table 1, values of L1 and L2 were determined from optical distances measured by using Precision Reflectometer (HP-8504B) manufactured by Hewlett-Packard Co.

TABLE 1

| Sample name | L2/L1 | ΔPf/Pf (%) (Measurement condition 1) | ΔIm/Im (%) (Measurement condition 1) | ΔPf/Pf (%) (Measurement condition 2) | ΔIm/Im (%) (Measurement condition 2) |
|---|---|---|---|---|---|
| Sample 1 | 2.111 | — | — | 0.06 | 0.03 |
| Sample 2 | 2.337 | 0.03 | 0.03 | 0.07 | 0.02 |
| Sample 3 | 2.420 | — | — | 0.15 | 0.05 |
| Sample 4 | 2.512 | 0.08 | 0.16 | 0.15 | 0.12 |
| Sample 5 | 2.920 | 0.04 | 0.08 | 0.09 | 0.03 |
| Sample 6 | 2.963 | 0.22 | 0.22 | 0.09 | 0.15 |
| Sample 7 | 2.974 | 0.12 | 0.26 | 0.10 | 0.17 |
| Sample 8 | 3.012 | — | — | 0.14 | 0.51 |
| Sample 9 | 3.014 | 0.50 | 1.58 | 0.32 | 1.01 |
| Sample 10 | 3.864 | — | — | 0.07 | 0.03 |
| Sample 11 | 4.024 | 0.24 | 0.95 | 0.15 | 0.46 |
| Sample 12 | 4.469 | 0.04 | 0.95 | 0.04 | 0.03 |
| Comparative sample 13 | 2.003 | 6.74 | 21.02 | 1.73 | 5.64 |
| Comparative sample 14 | 2.994 | 2.97 | 10.60 | 0.49 | 1.36 |
| Comparative sample 15 | 3.001 | 5.32 | 17.87 | 2.98 | 10.39 |
| Comparative sample 16 | 3.002 | 5.03 | 15.89 | 1.17 | 3.95 |
| Comparative sample 17 | 4.005 | 0.22 | 0.50 | 0.14 | 0.26 |

The birefringent fiber may also be an elliptic core fiber with a core of elliptic cross section that forms an asymmetric waveguide structure.

Any of a discrete lens system, a lensed fiber, and a ball-lensed fiber, or the like is selected as required for an optical coupling means for the purpose of coupling a laser light emitted from the front facet f of the semiconductor laser 6 to the optical fiber 5.

The semiconductor laser 6 emits a laser light from its front facet f toward the optical fiber 5, and emits a monitor light from its rear facet r toward the photodiode 7.

Next, stability of the optical output in the semiconductor laser device of the present invention is shown in comparison with the conventional semiconductor laser device. A semiconductor laser in the 1480 nm band is used as the semiconductor laser 6. A cavity length of the semiconductor laser used is 1.3 mm, and an effective refractive index of an active layer is about 3.2. The measurement was performed for the semiconductor laser device having two FBGs (FBG1 and FBG2). As a comparative sample, a semiconductor laser device with the value of L2/L1 that falls within the range of N−0.01 to N+0.01 is made.

Figure 4:
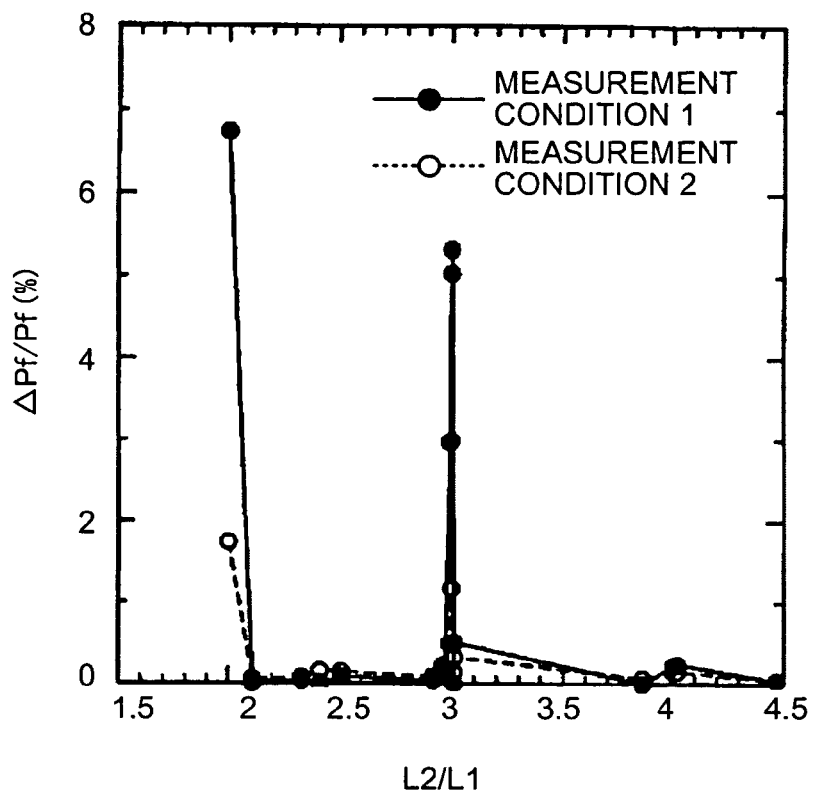
FIG. 4 is a graph showing a relationship between a fluctuation rate $\Delta Pf/Pf$ of a light output from the end of a fiber and L2/L1.
Figure 5:
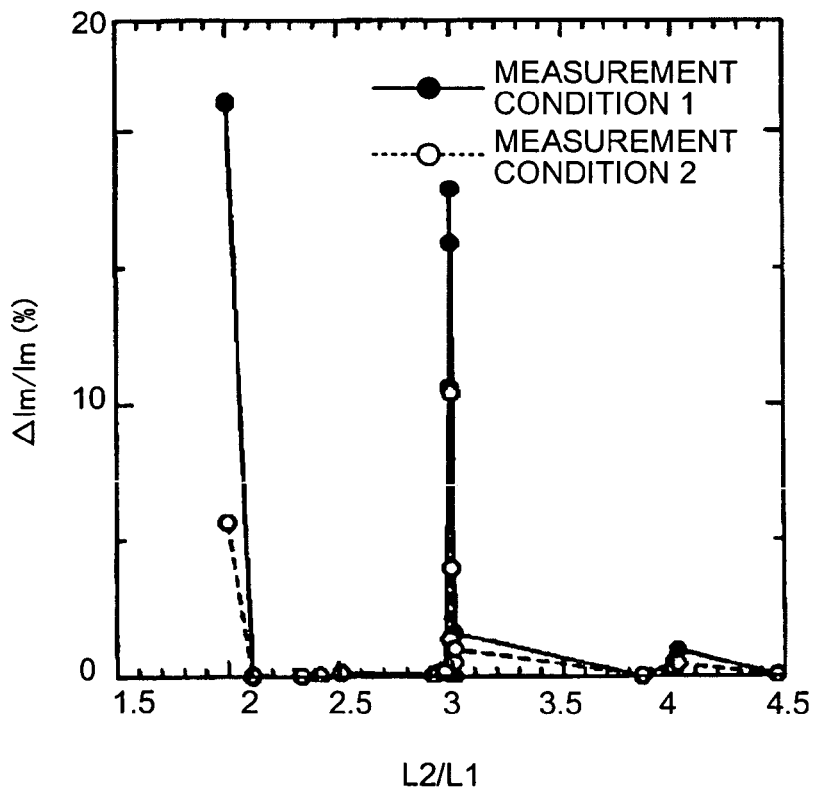
FIG. 5 is a graph showing a relationship between a fluctuation rate $\Delta Im/Im$ of a detection current of a light received by a photodiode and L2/L1.

The stability data of a light output of the semiconductor laser device according to the present invention is tabulated in table 1. Specifically, Table 1 contains the measurement results of a fluctuation rate ΔPf/Pf of a light output Pf from the end of the fiber 5 and a fluctuation rate ΔIm/Im of a detection current Im of a light received by the photodiode 7, obtained for samples 1 to 12 which are the semiconductor laser device according to the present invention and for comparative samples 13 to 17. It is noted that columns with a mark "-" indicate that the measurement was not performed. Measurement condition 1 indicates that an injection current to the semiconductor laser 6 is 100 mA to 150 mA, and measurement condition 2 indicates that an injection current to the semiconductor laser 6 is 200 mA to 1000 mA. Table 1 tabulates average values of fluctuation rate obtained for each The results shown in Table 1 are shown in FIG. 4 and FIG. 5 in the form of graphs, in which the value of L2/L1 is plotted on the horizontal axis, and ΔPf/Pf or ΔIm/Im is plotted on the vertical axis, respectively.

The above results show that the fluctuation rates of Pf and Im in the samples 1 to 12 according to the present invention are smaller as compared with the fluctuation rates thereof in the comparative samples 13 to 17. Moreover, among the samples 1 to 12, in particular, the fluctuation rates in the samples 1 to 5 and the sample 12, whose values of L2/L1 does not fall within the range of N±0.027, are further smaller as compared with those in the samples 8, 9, and 11, whose values of L2/L1 does not fall within the range of N±0.01 but fall within the range of N±0.027. Therefore, a preferred embodiment of the present invention is such that the value of L2/L1 does not fall within the range of N−0.027 to N+0.027. Still more preferably, the value of L2/L1 does not fall within the range of N−0.05 to N+0.05.

In this manner, the present invention provides a semiconductor laser device of excellent stability, with extremely reduced fluctuations in a light output from the end of the fiber and an output of a monitor light.

The inventors of this invention have found that whether L2/L1 is a value around an integer can be determined by measuring relative intensity noise (RIN).

Figure 6:
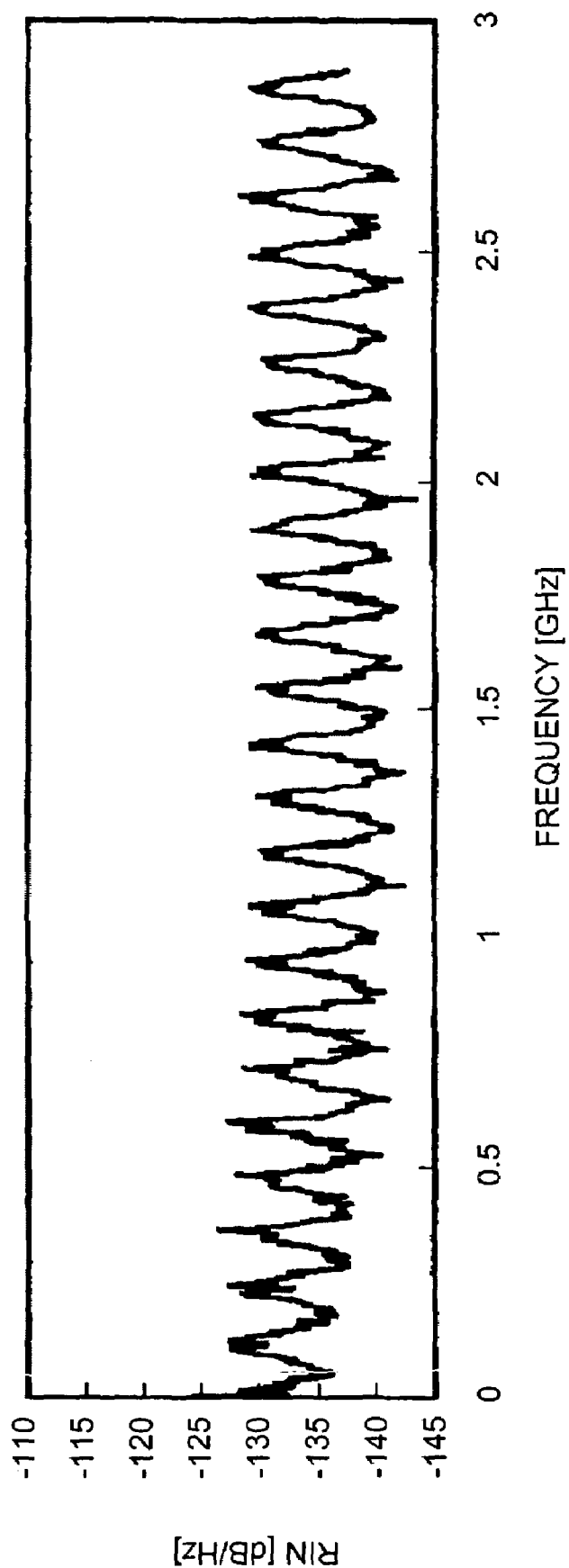
FIG. 6 is a graph showing a frequency spectrum of RIN in the semiconductor laser device which has only one FBG.
Figure 7:
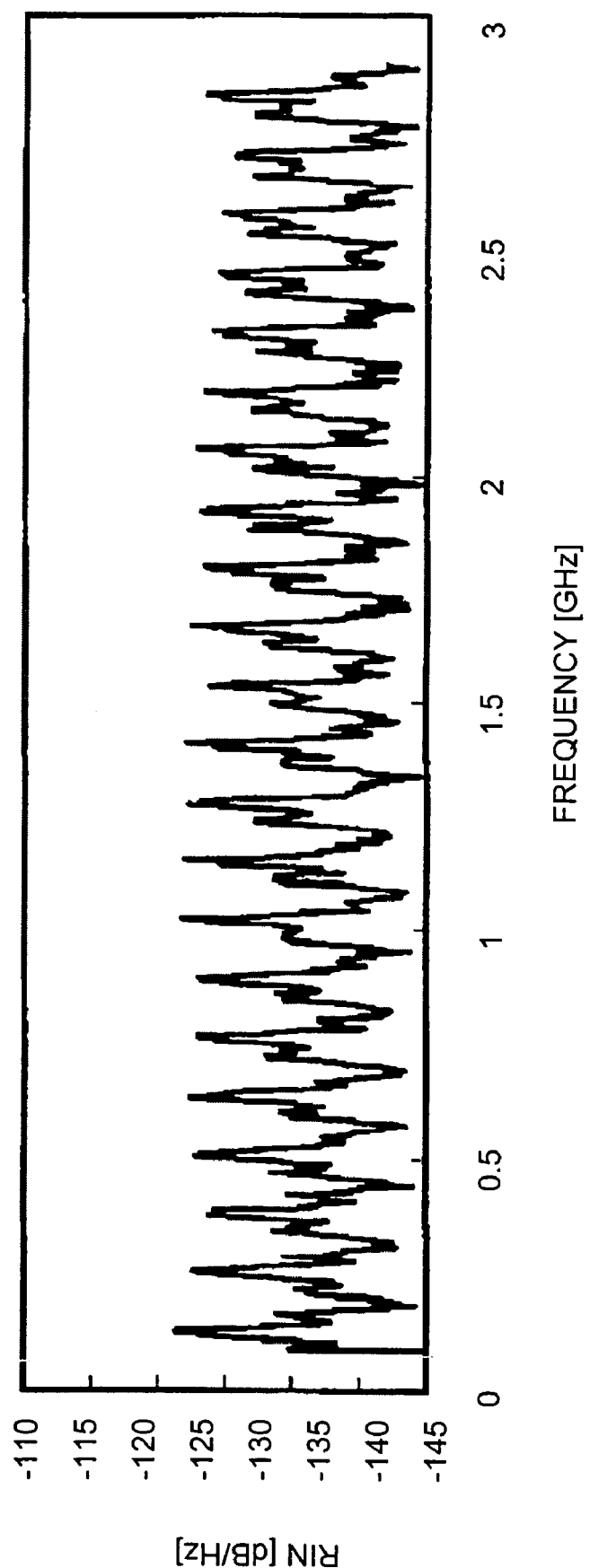
FIG. 7 is a graph showing a frequency spectrum of RIN in the semiconductor laser device which has two FBGs and in which L2/L1 is set so as to be an almost integer.
Figure 8:
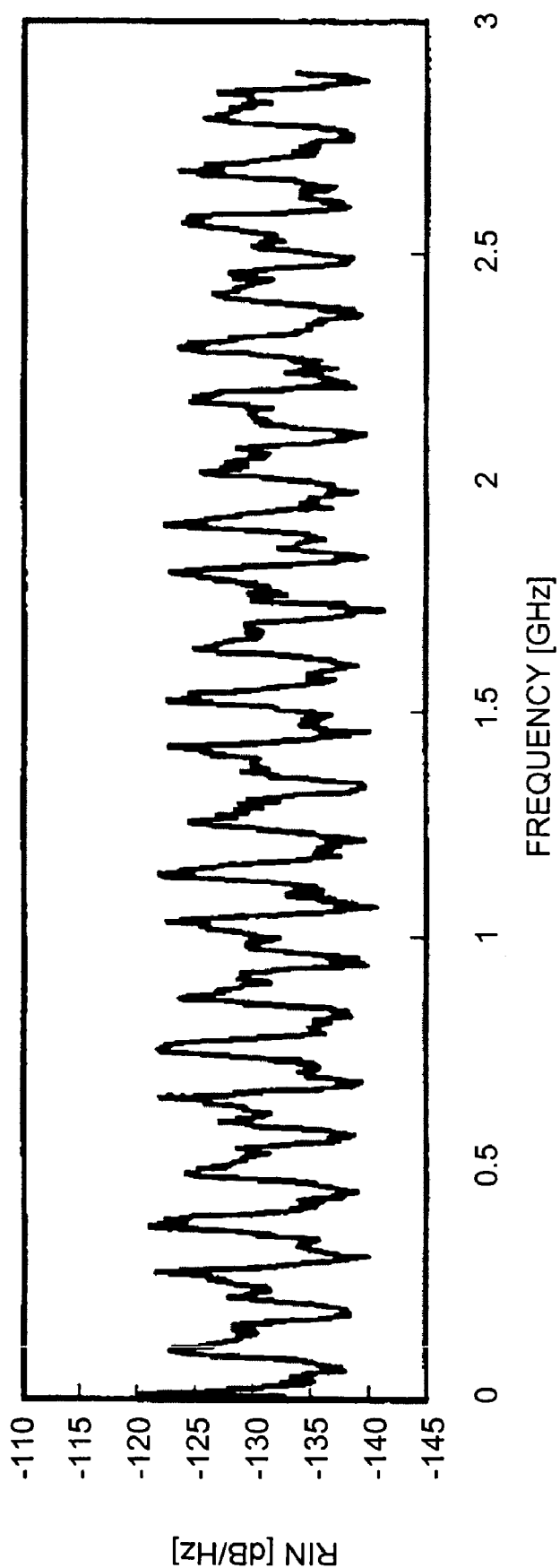
FIG. 8 is a graph showing a frequency spectrum of RIN in the semiconductor laser device which has two FBGs and in which L2/L1 is set so as to be out of an integer value.

FIGS. 6 to 8 are frequency spectra of RIN obtained by measuring semiconductor laser devices in which the number of FBGs and positions thereof are different from each other. An injection current to the laser upon measurement was set to 1000 mA. Among these semiconductor laser devices, the semiconductor laser device corresponding to FIG. 6 has only one FBG. In FIG. 6, a periodicity in RIN spectrum, which is characteristic of the semiconductor laser device having the FBG, is reflected.

On the other hand, the semiconductor laser device corresponding to FIG. 7 has two FBGs, which are arranged so that L2/L1 is almost an integer. A RIN spectrum in this case is in a form in which a plurality of periodic components are superimposed. The instability of a light output was observed in this semiconductor laser device.

The semiconductor laser device corresponding to FIG. 8 includes two FBGs, which are arranged so that L2/L1 is out of an integer value. A RIN spectrum in this case is in a form in which an irregular component with no periodicity is superimposed on a single periodic component as shown in FIG. 6. In this semiconductor laser device, the light output was stable with no fluctuation over time.

By measuring the RIN spectrum in this manner, it is possible to determine whether L2/L1 is almost an integer value.

Figure 9:
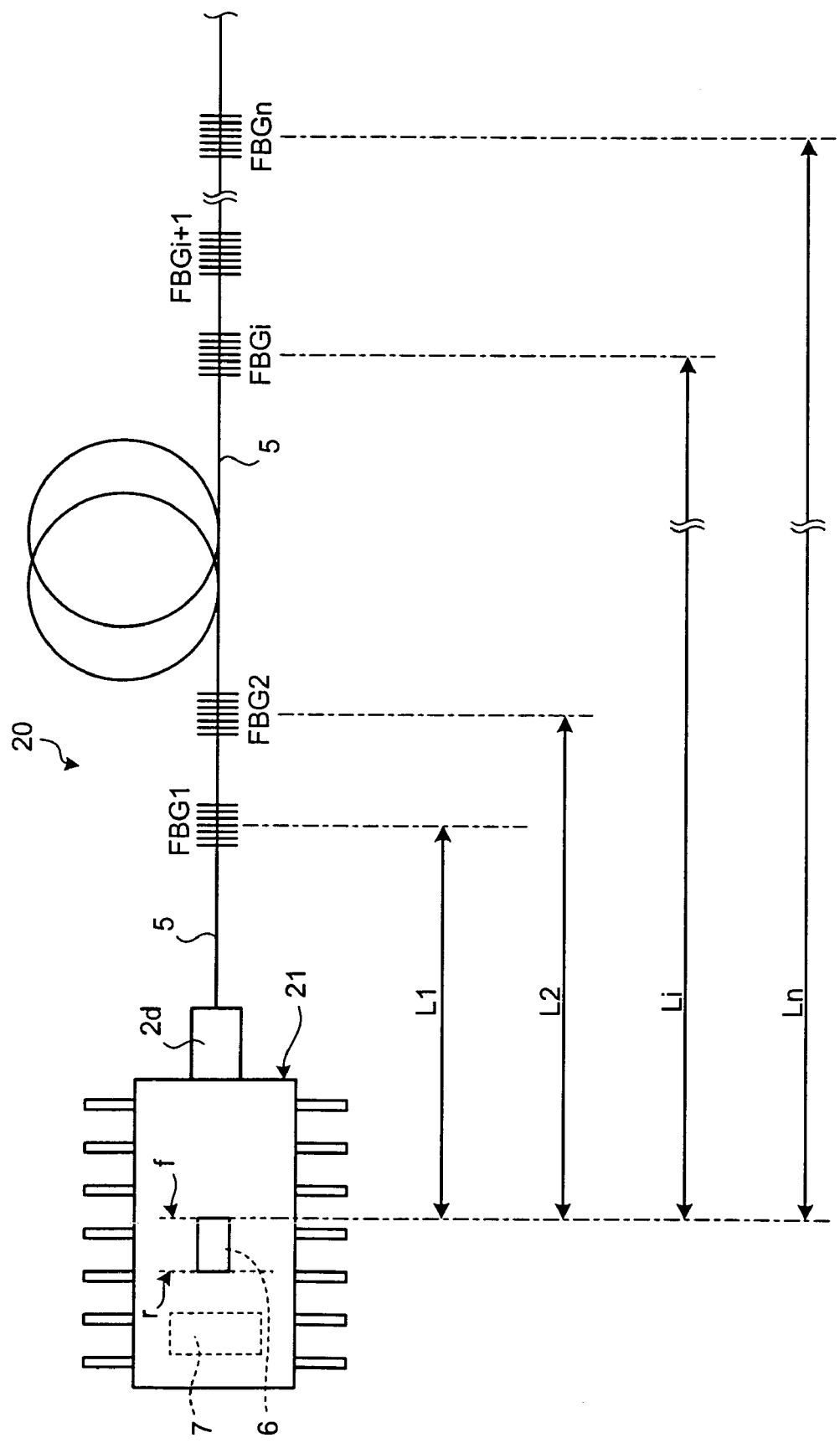
FIG. 9 is a schematic diagram of a modification of the semiconductor laser device according to the first embodiment.

The example of the semiconductor laser device having two FBGs was explained as the first embodiment. In the present invention, however, the number of FBGs may be three or more as shown in FIG. 9. In this case, assuming that Li is an optical distance from the front facet f of the semiconductor laser to an i-th FBGi (i=2, 3, ..., n), each position of FBGi is set so that Li/L1 does not fall within a range of N−0.01 to N+0.01. More preferably, it is set so that Li/L1 does not fall within a range of N−0.05 to N+0.05.

Figure 10:
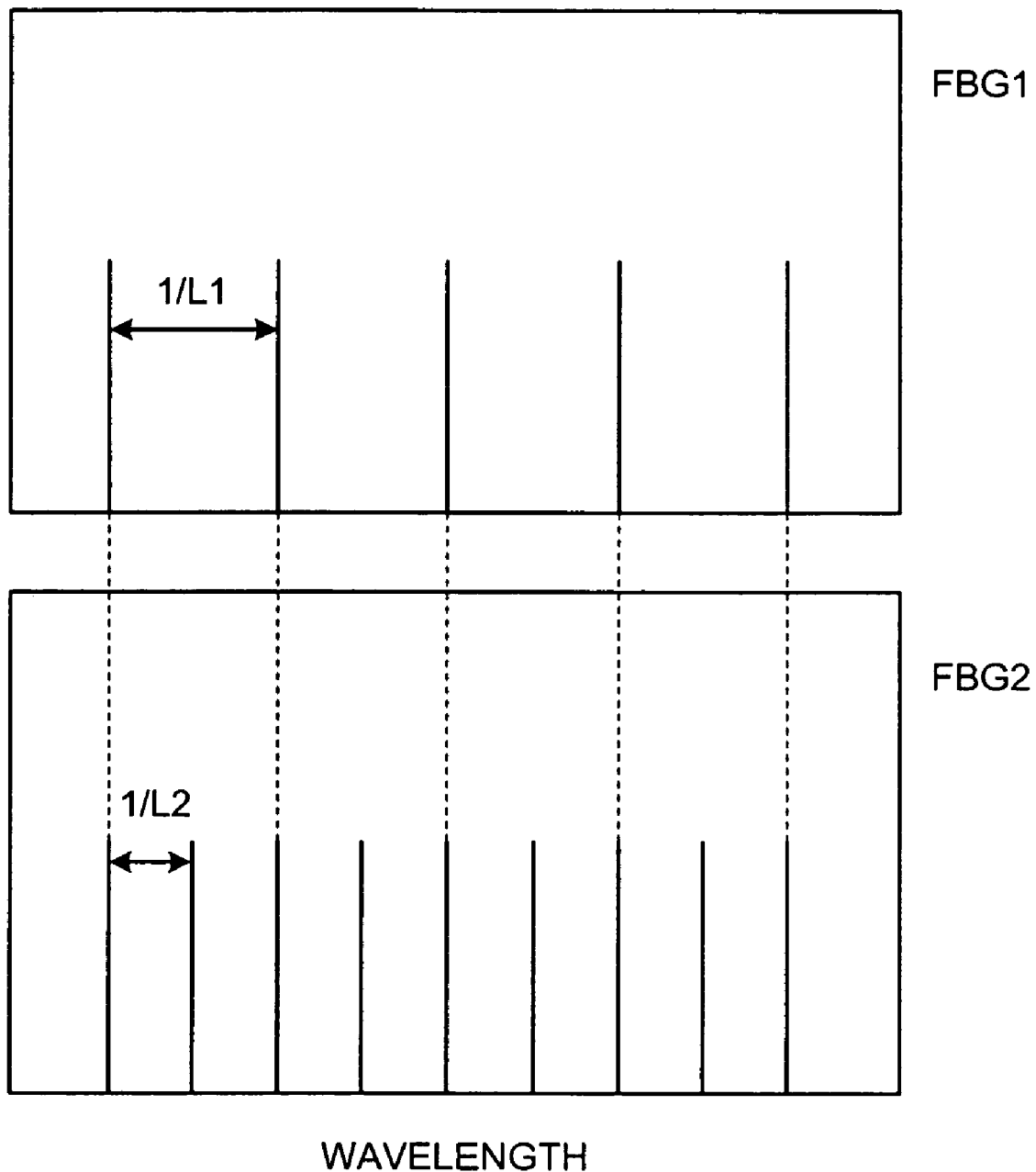
FIG. 10 is a diagram for explaining a longitudinal mode interval in the semiconductor laser device using FBG, in the case of N=2.

The present invention acts as follows. In a semiconductor laser device having an external resonator formed by the FBGs, longitudinal modes corresponding to the external resonator are present, and are arranged at a frequency interval proportional to an inverse of L1 and Li (i=2, 3, ..., n). For example, when Li/L1 takes almost an integer value, one out of every N longitudinal modes caused by the FBGi overlaps with a longitudinal mode caused by the FBG1. The situation is shown in FIG. 10 for a case of N=2. The more the longitudinal modes overlap, the more intense the competition becomes between the longitudinal modes, which acts to increase instability of the light output. The probability of overlapping between the longitudinal modes becomes smaller for greater value of N, and hence, the degree of instability is smaller for greater value of N.

Figure 11:
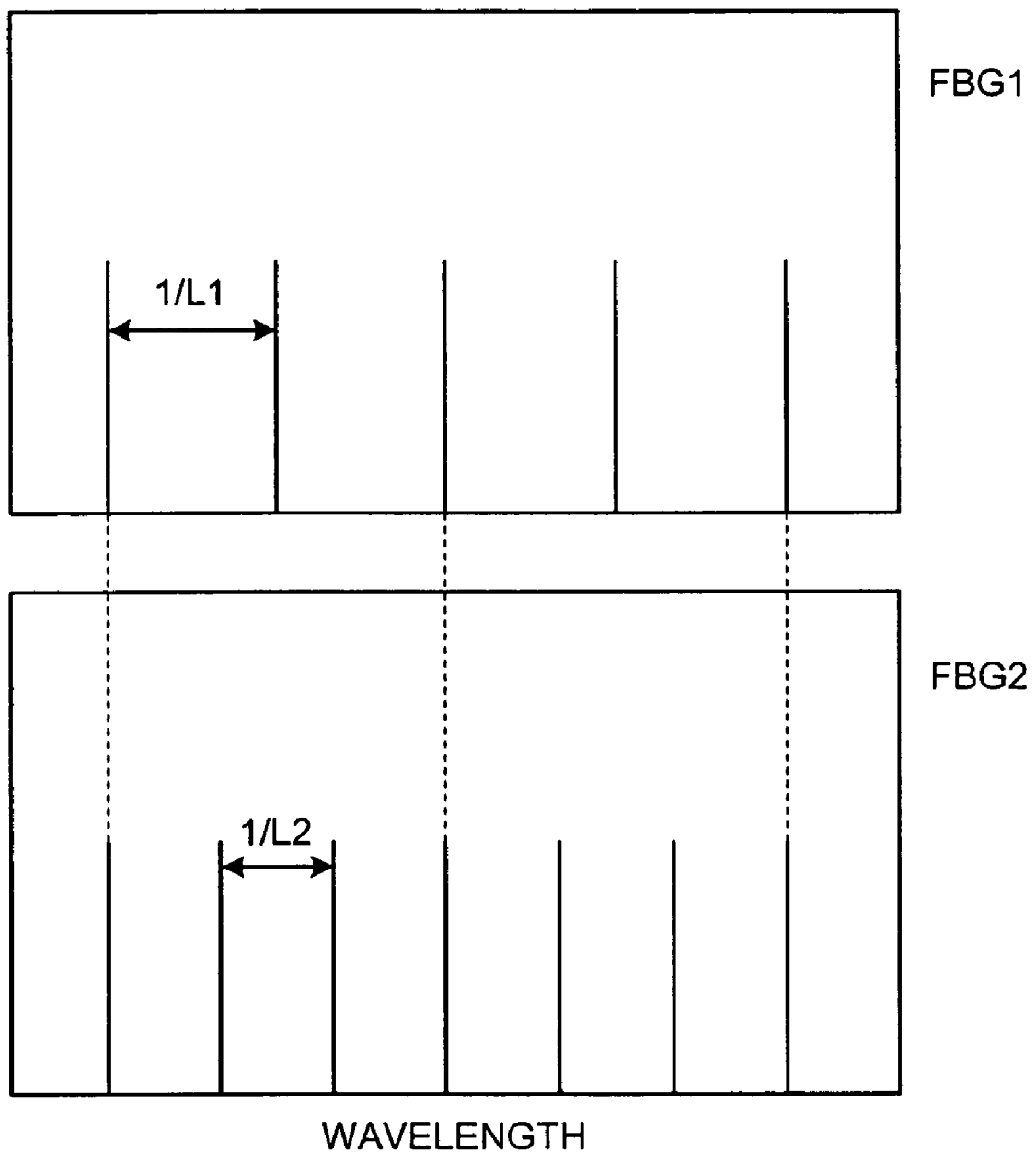
FIG. 11 is a diagram for explaining a longitudinal mode interval in the semiconductor laser device using FBG, in the case of P=3 and Q=2.
Figure 12:
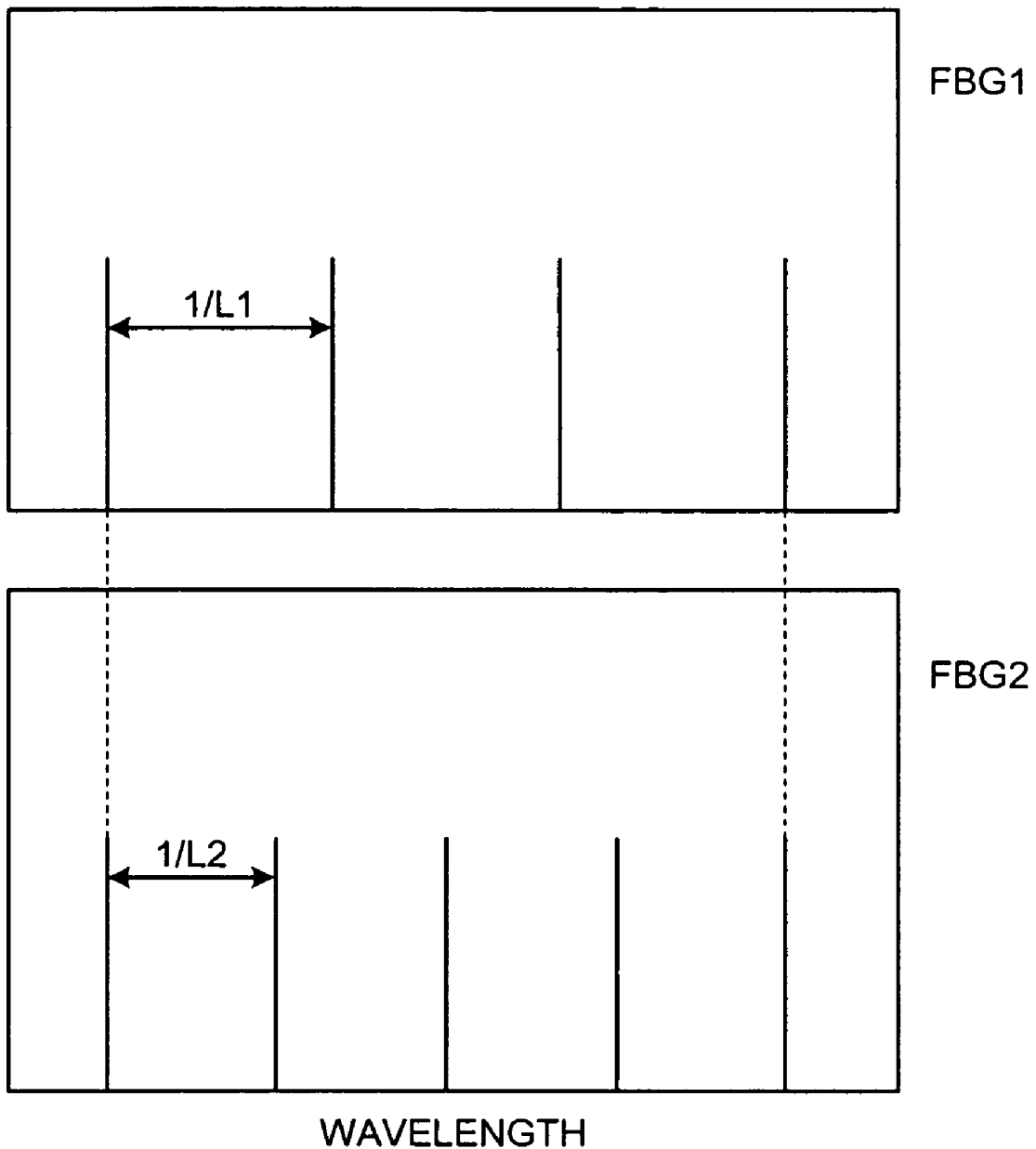
FIG. 12 is a diagram for explaining a longitudinal mode interval in the semiconductor laser device using FBG, in the case of P=4 and Q=3.

Furthermore, in the case where Li is P/Q times of L1 (P and Q are natural numbers which are relatively prime, where P>Q, that is, the case where Li/L1 is a rational number greater than 1), holds an equality $(1/L1) \times Q = (1/Li) \times P$ regarding the longitudinal mode intervals of both external resonators. In this case, the longitudinal modes caused by the two FBGs (FBG1 and FBGi) overlap each other in such a way that one out of every Q longitudinal modes caused by the FBG1 and one out of every P longitudinal modes caused by the FBGi overlaps with the longitudinal mode of the other FBG. For example, when P/Q=3/2, the longitudinal modes caused by the two FBGs overlap each other in such a way that one out of every two longitudinal modes caused by the FBG1 and one out of every three longitudinal modes caused by the FBGi overlap (see FIG. 11). Likewise, when P/Q=4/3, longitudinal modes caused by the two FBGs overlap each other in such a way that one out of every three longitudinal modes caused by the FBG1 and one out of every four longitudinal modes caused by the FBGi overlap (see FIG. 12). When the longitudinal modes of the external resonators overlap each other in this manner, the light output is likely to be unstable. Therefore, it is also effective to set the optical distance of FBGs in such a manner that for a rational number P/Q, the value of Li/L1 does not fall within a range of P/Q−0.01 to P/Q+0.01.

For greater values of P and Q, the effects of overlapping of the longitudinal modes are considered smaller, and the degree of instability of the light output decreases thereby. Practically, it is sufficient to set the optical distance between the FBGs in such a manner that the value of Li/L1 does not fall within the range of P/Q−0.01 to P/Q+0.01, for all combinations of relatively prime natural numbers P and Q selected to satisfy that the sum of P and Q is not greater than 5 and P>Q.

In addition, it is understood from FIGS. 4 and 5 that when the value of L2/L1 is greater than 4 (L2/L1>4.01), ΔPf/Pf and ΔIm/Im are small regardless of N, P, and Q. Therefore, setting the value to Li/L1>4.01 is effective for stabilization of the light output.

Consequently, in the semiconductor laser device including a semiconductor laser having a front facet from which an output light is emitted; an optical fiber to which the output light emitted is input; a first light feedback element configured to feed the output light back to the semiconductor laser and positioned at the optical distance L1 from the front facet; and n portions of light feedback element (n≧2) each i-th light feedback element (i=2, 3, ..., n) configured to feed the output light back to the semiconductor laser and positioned at the optical distance Li from the front facet, it is possible to obtain excellent stability of the light output by setting the position of the i-th light feedback element such that the value of Li/L1 does not fall within the range of P/Q−0.01 to P/Q+0.01 for a positive rational number P/Q which is not an integer.

It is desirable that an optical distance between adjacent light feedback elements is not smaller than 5 mm, preferably not smaller than 10 cm, and more preferably, not smaller than 50 cm.

According to the first embodiment, a plurality of light feedback elements (FBG1 to FBGn) are serially arranged on a single thread of optical fiber 5. However, according to a second embodiment of the present invention, at least FBG2 to FBGn are connected in parallel to each other.

Figure 13:
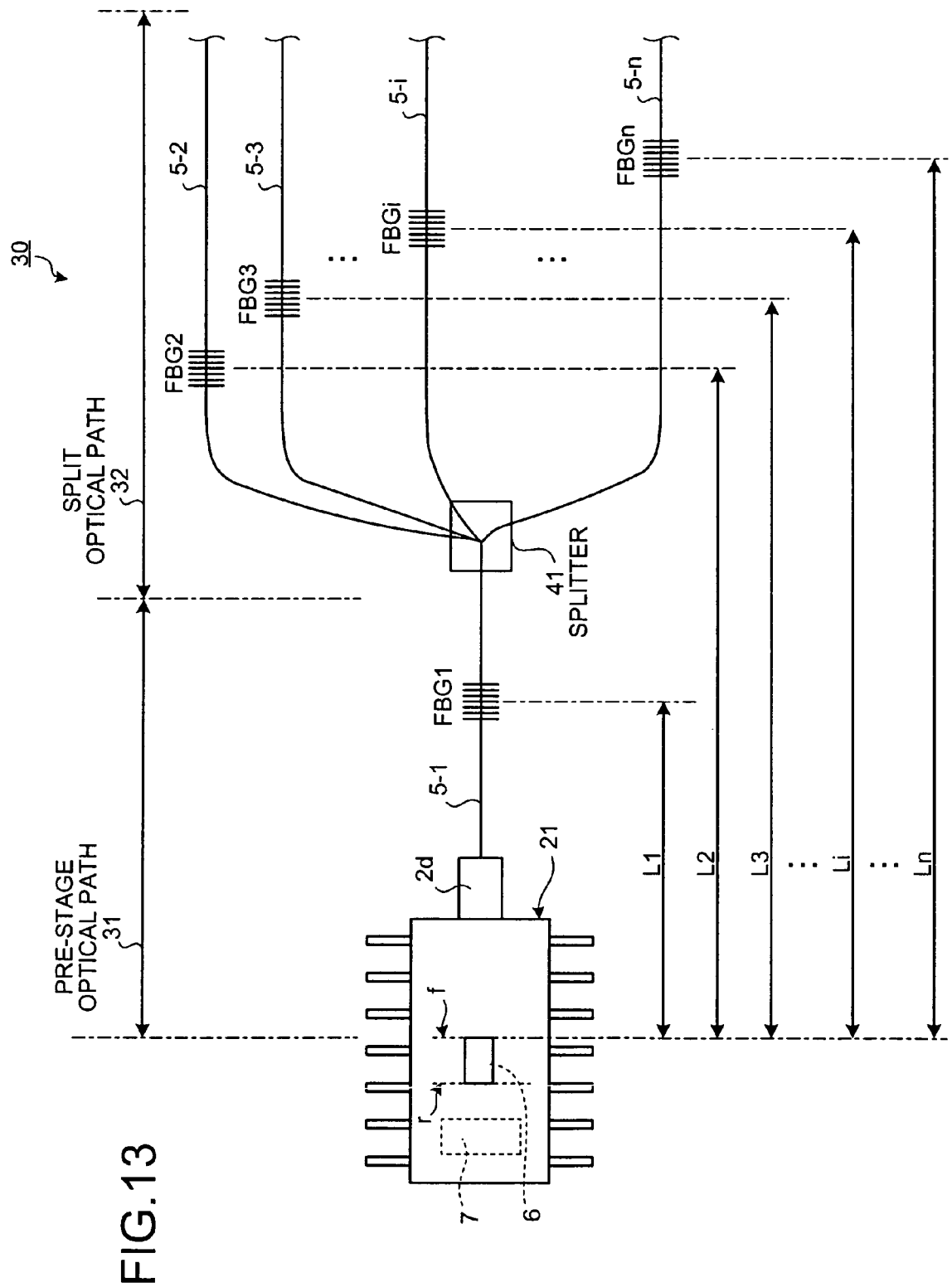
FIG. 13 is a schematic diagram of a semiconductor laser device according to a second embodiment of the present invention.

FIG. 13 is a schematic diagram of a semiconductor laser device 30 according to the second embodiment. The semiconductor laser device 30 has a splitter 41, disposed between an FBG1 and each of FBG2 to FBGn, for splitting a light into (n−1) lights. The FBG1 is disposed at the position of the optical distance L1 on an optical fiber 5-1 corresponding to the optical fiber 5. The FBG2 to FBGn are disposed at positions of the optical distances L2 to Ln on optical fibers 5-2 to 5-n, respectively, which are branched by the splitter 41. Here, a portion between the front facet f of the semiconductor laser 6 and a connection point of the splitter 41 forms a pre-stage optical path 31, and the splitter 41 and the optical fibers 5-2 to 5-n form branch optical paths 32. Parameters such as a reflection center wavelength of each of FBG1 to FBGn and each optical distance are the same as those of the first embodiment, and all parameters of modifications of the first embodiment can also be applied to the second embodiment.

The laser light may be subjected to total reflection at each output end of the FBG2 to FBGn or part of the laser light may be output therefrom. Furthermore, branching ratios of the splitter 41 to the optical fibers 5-2 to 5-n may be arbitrarily set.

In the second embodiment, a plurality of FBGs are provided not on the single thread of the optical fiber 5, but instead, each of the optical fibers 5-1 to 5-n is provided with one FBG, and the optical fibers 5-1 to 5-n each being provided with one FBG are combined by the splitter 41. Such configuration is helpful in suppressing multiple reflection between the plurality of FBGs, easy to manufacture and easy to do maintenance such as repair.

Figure 14:
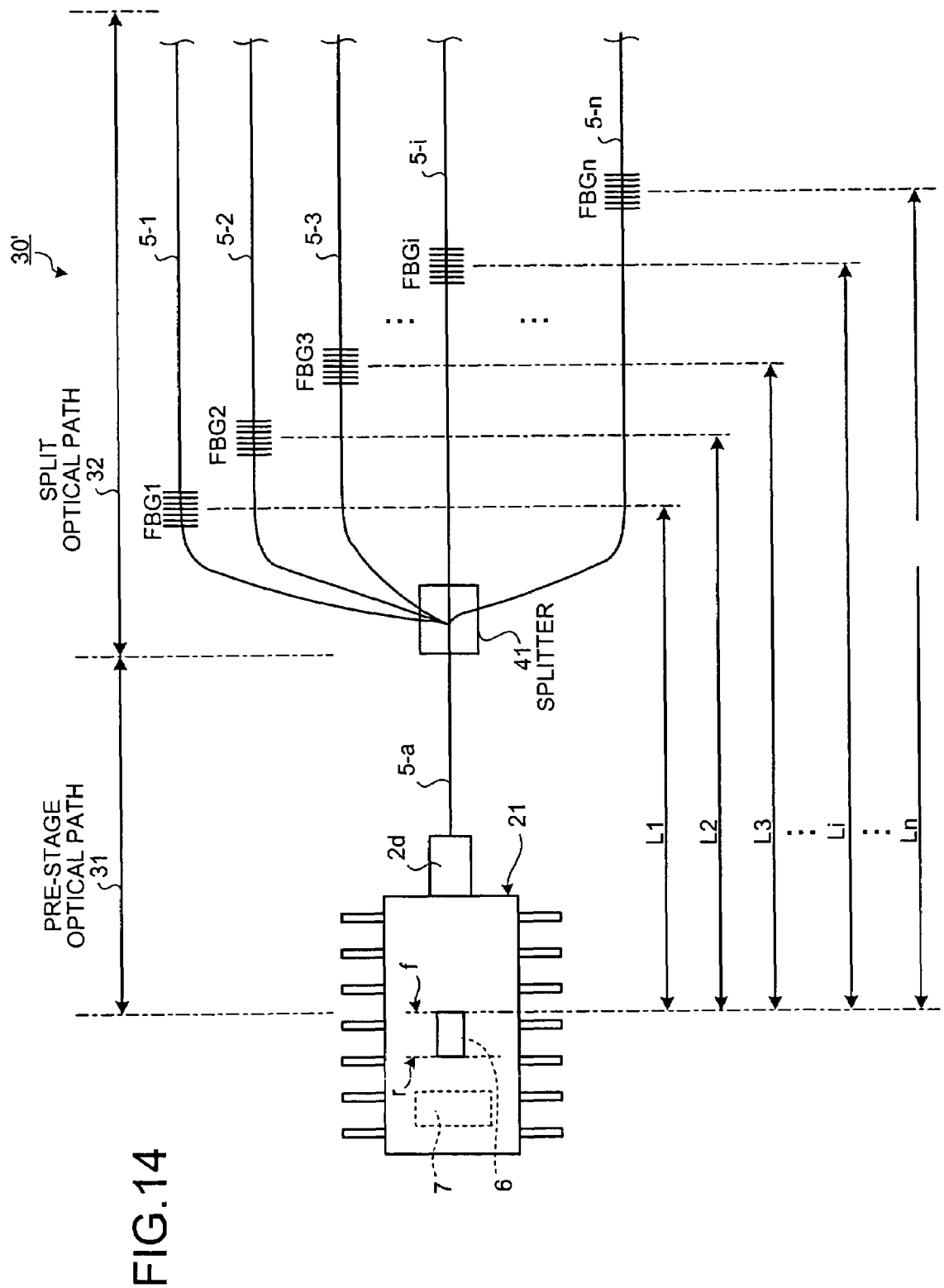
FIG. 14 is a schematic diagram of a modification of the semiconductor laser device according to the second embodiment.

Incidentally, FBG1 may not be provided on an optical fiber 5-a of the pre-stage optical path 31. Instead, the FBG1 may be provided on any one of the branch optical paths 32, like a semiconductor laser device 30' shown in FIG. 14. In this case, the splitter 41 branches the optical fiber 5 into n threads of optical fibers. Needless to say, the optical distance L1 up to the FBG1 is shorter as compared with the optical distances L2 to Ln up to the other FBG2 to FBGn, respectively.

A third embodiment of the present invention is provided with a polarization-combiner in addition to the configuration shown in the second embodiment in order to output a light with reduced degree of polarization.

Figure 15:
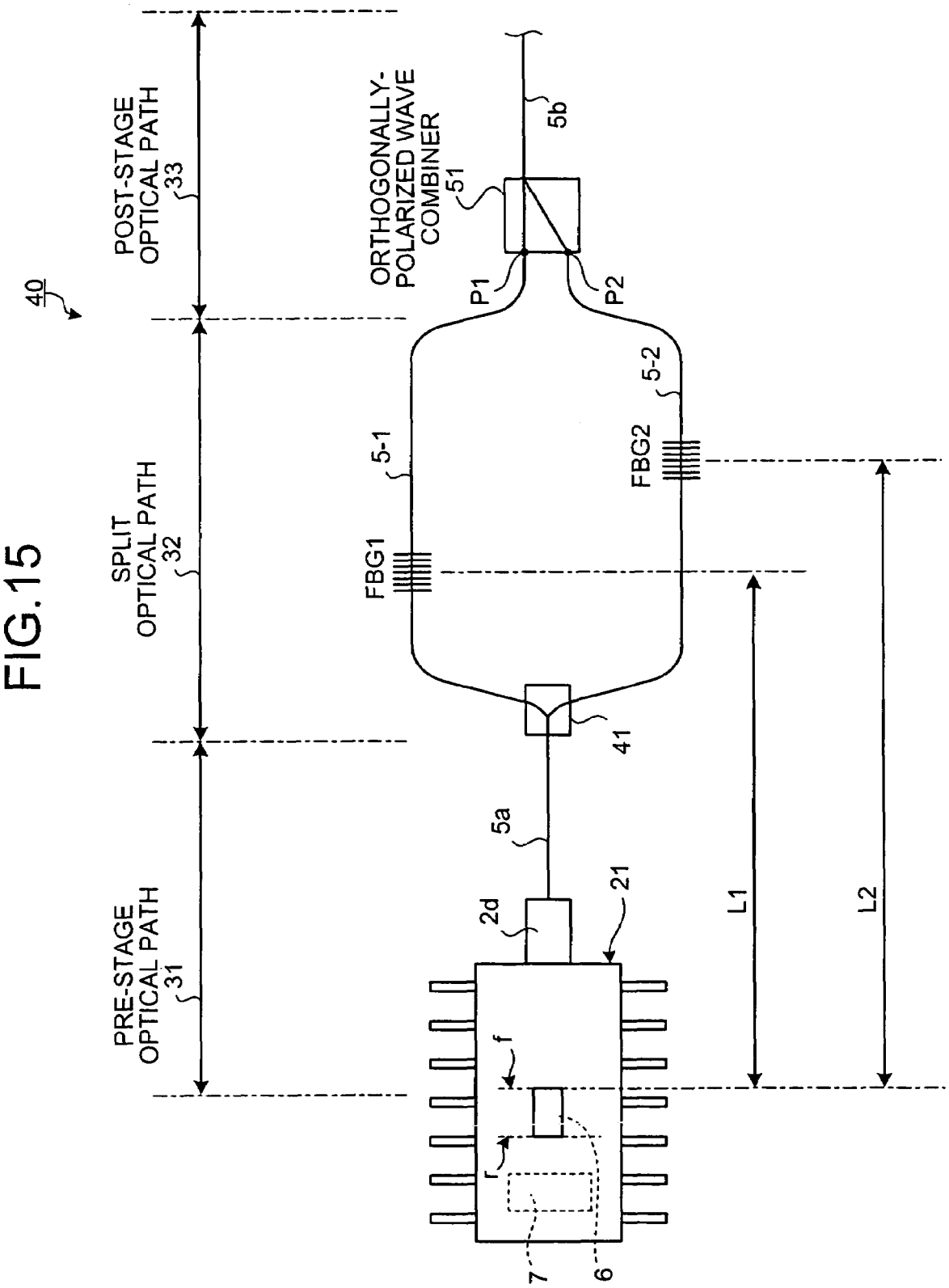
FIG. 15 is a schematic diagram of a semiconductor laser device according to a third embodiment of the present invention.

FIG. 15 is a diagram showing the configuration of a semiconductor laser device 40 according to the third embodiment. The semiconductor laser device 40 includes a post-stage optical path 33 which has a polarization-combiner 51. The post-stage optical path 33 is provided downstream of the branch optical paths 32 each having FBG1 or FBG2. The polarization-combiner 51 is implemented by birefringent crystal such as rutile. Light beams input to input ports P1 and P2 are set orthogonal to each other. Such an orthogonal input of light beams to the input ports P1 and P2 can be easily implemented by forming the optical fibers 5-1 and 5-2 by polarization maintaining fibers (PMF). The light beams input to the polarization-combiner 51 are output to the outside through an optical fiber 5b. It is noted that reference numeral 5a also represents the optical fiber.

Depolarization of a laser light is more effectively performed when coherency of the laser light to be depolarized is lower. In this embodiment, since the coherency of the laser light input to the polarization-combiner 51 has been reduced by using the plurality of FBGs, the light output from the optical fiber 5b is output as a light of which degree of polarization is surely reduced.

As a method to obtain a depolarized laser light of reduced degree of polarization, a technology as follows is known. More specifically, the technology is such that a second PMF is fusion-spliced to the front end of an output PMF in such a manner that their principal axes are displaced by 45 degrees, and the laser light is caused to propagate through the second PMF, to obtain the light with reduced degree of polarization from its other end. However, this technology has such a problem that the degree of polarization of the laser light to be output may fluctuate depending on conditions such as environmental temperature. Furthermore, in the technology, the length of the second PMF used for depolarization needs to be adequately selected, but because it is difficult to adjust the length, the light with reduced degree of polarization could not be surely obtained. In contrast, the semiconductor laser device 40 shown in the third embodiment surely allows output of the laser light with reduced degree of polarization.

In the first to the third embodiments, a plurality of FBG1 to FBGn are provided, and each of the optical distances between the FBG1 and FBGn is defined by each of the positions at which the FBG1 to FBGn are arranged on the optical fibers. In contrast, in a fourth embodiment of the present invention, a plurality of optical distances are obtained by a single FBG.

Figure 16:
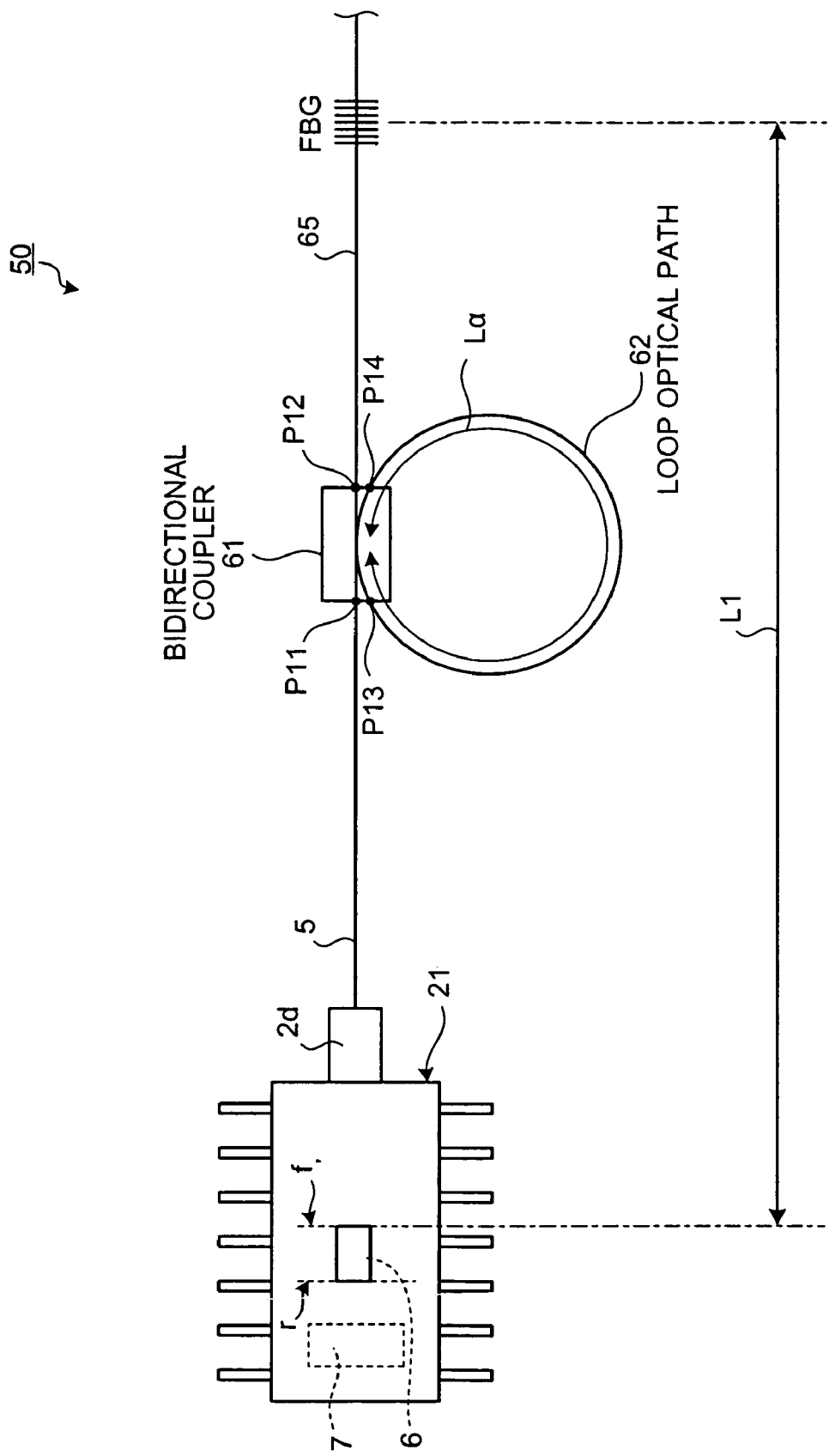
FIG. 16 is a schematic diagram of a semiconductor laser device according to a fourth embodiment of the present invention.

FIG. 16 is a schematic diagram of a semiconductor laser device 50 according to the fourth embodiment. The semiconductor laser device 50 uses only one FBG, and includes a bidirectional optical coupler 61 which is disposed between the FBG and the front facet f of the semiconductor laser 6, and also includes a loop optical path 62.

An optical distance between the front facet f of the semiconductor laser 6 and the FBG is set to L1 (which indicates an optical distance for the light which does not pass through the loop optical path 62). The bidirectional optical coupler 61 is implemented by a 2×2 optical coupler or the like, and has four input-output ports P11 to P14. The input-output port P11 is connected to the side of the semiconductor laser 6 through the optical fiber 5. The input-output port P12 is connected to the FBG through an optical fiber 65. The input-output ports P13 and P14 are connected with an optical fiber having an optical distance of Lα, which forms the loop optical path 62.

The laser light output from the semiconductor laser 6 is input to the input-output port P11 through the optical fiber 5. As shown in FIG. 17, among the light that is output to FBG, a part of it is directly output to the FBG via the input-output port P12, and the remaining part circulates in the loop optical path 62 via the input-output ports P14 and P13 before entering the FBG. On the other hand, the light reflected from the FBG is input to the input-output port P12, and part of the light is directly output from the input-output port P11 to the semiconductor laser 6, and the remaining part of the light circulates in the loop optical path 62 before being output to the semiconductor laser 6.

The above-mentioned configuration is similar to a virtual configuration in which a plurality of FBG1 to FBGn are present, the plurality of FBGs each having the optical distances L1 to Ln respectively which correspond to the combination of (S+1)×(S+1) lines of optical paths, where S is the number of circulation in the loop optical path 62. A large number of optical paths, which is almost infinite, can be formed by only one loop optical path 62 due to the circulations. This can obtain the same effect as the case where many FBGs are actually provided, and also can further reduce the coherency with a simple configuration in the same manner as that of the first to the third embodiments. Moreover, the reduction in size and weight of the semiconductor laser device can be promoted.

The bidirectional optical coupler 61 has 2×2, i.e. two input ports and two output ports, but the number is not limited thereto. Therefore, the bidirectional optical coupler 61 may have m×n input-output ports, and input-output ports other than the input-output ports P11 and P12 may be connected by an optical fiber to form a loop optical path. In this case, optical distances of a plurality of loop optical paths formed are made preferably different from one another thereamong. Alternatively, the degree of coupling between input-output ports of the bidirectional optical coupler 61 may be made different from each other.

According to the first to the fourth embodiments, the case where the light feedback element is formed with FBG is explained, but at least one light feedback element may be a dielectric film or a section of a fiber.

Furthermore, the first to the fourth embodiments describe the semiconductor laser device with an output wavelength in the 1480-nm band, used as a pump light source for an Erbium-doped fiber amplifier (EDFA). The wavelength band to which the present invention is applied, however, is not particularly limited. Therefore, the present invention is also applicable to a semiconductor laser device having an output wavelength band of 1380 nm to 1520 nm used as a pump light source for a Raman amplifier, and also to a semiconductor laser device having 980-nm band or having an output wavelength band of about 930 nm to about 1060 nm. Furthermore, the application of the semiconductor laser device according to the present invention is not limited to an optical fiber amplifier. The present invention is also applicable as laser devices for a wide range of industries.

According to the present invention, it is possible to obtain a semiconductor laser device having a high degree of stability in light output even though an FBG is used.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser device comprising:
   a semiconductor laser having a front facet from which an output light is emitted;
   a first light feedback element arranged at an optical distance L1 from the front facet on an optical path of the output light, the first light feedback element having a predetermined reflection center wavelength and configured to feed a part of the output light back to the semiconductor laser; and
   an i-th light feedback element among (n−1) light feedback elements, each arranged at an optical distance Li from the front facet on the optical path of the output light (where i=2 to n, n is a positive integer not less than 2, and Li>L1), the i-th light feedback element each having a reflection center wavelength substantially equal to the reflection center wavelength of the first light feedback element and configured to feed a part of the output light back to the semiconductor laser, wherein
   L1 and Li satisfies $((M-1)+0.01)<(Li/L1)<(M-0.01)$ where M is a positive integer not less than 2, satisfying $(M-1)<(Li/L1)\leq M$, and an optical distance between adjacent light feedback elements among the (n−1) light feedback elements is not smaller than 50 cm.

2. The semiconductor laser device according to claim 1, wherein L1 and Li satisfies $((M-1)+0.027)<(Li/L1)<(M-0.027)$.

3. The semiconductor laser device according to claim 1, wherein Li/L1 is not less than 4.01.

4. The semiconductor laser device according to claim 1, further comprising:
   an optical fiber that includes the optical path to which the output light emitted from the semiconductor laser is input and through which the output light propagates, wherein
   the first light feedback element and the i-th light feedback element (i=2 to n) are fiber Bragg gratings formed in the optical fiber.

5. The semiconductor laser device according to claim 1, wherein a wavelength of the output light is within 1480 nm band.

6. The semiconductor laser device according to claim 1, wherein the optical path includes
   a pre-stage optical path to which the output light emitted from the semiconductor laser is input; and a j-th branch optical path (where j=1 to m, and m is a positive integer not less than 2) into which the pre-stage optical path is branched, and
   the first light feedback element and the i-th light feedback element (i=2 to n) are arranged on either one of the pre-stage optical path and the j-th branch optical path (j=1 to m).

7. A semiconductor laser device comprising:
   a semiconductor laser having a front facet from which an output light is emitted;
   a first light feedback element arranged at an optical distance L1 from the front facet on an optical path of the output light, the first light feedback element having a predetermined reflection center wavelength and configured to feed a part of the output light back to the semiconductor laser; and
   an i-th light feedback element among (n−1) light feedback elements, each arranged at an optical distance Li from the front facet on the optical path of the output light (where i=2 to n, n is a positive integer not less than 2, and Li>L1), the i-th light feedback element each having a reflection center wavelength substantially equal to the reflection center wavelength of the first light feedback element and configured to feed a part of the output light back to the semiconductor laser, wherein
   L1 and Li satisfies either one of $(Li/L1)<(p/q-0.01)$ and $(Li/L1)>(p/q+0.01)$ for all combinations of relatively prime integers p and q selected to satisfy $(p+q)\leq 5$ and p>q, and
   an optical distance between adjacent light feedback elements among the (n−1) light feed elements is not smaller than 50 cm.

8. The semiconductor laser device according to claim 7, wherein
   L1 and Li satisfies, for all positive integer N, either one of $(Li/L1)<(p/q-0.01)$ and $(Li/L1)>(p/q+0.01)$ for all combinations of relatively prime integers p and q selected to satisfy $(p+q)\leq N$ and p>q.

9. The semiconductor laser device according to claim 7, wherein Li/L1 is not less than 4.01.

10. The semiconductor laser device according to claim 7, further comprising:
    an optical fiber that includes the optical path to which the output light emitted from the semiconductor laser is input and through which the output light propagates, wherein
    the first light feedback element and the i-th light feedback element (i=2 to n) are fiber Bragg gratings formed in the optical fiber.

11. The semiconductor laser device according to claim 7, wherein a wavelength of the output light is within 1480 nm band.

12. The semiconductor laser device according to claim 7, wherein the optical path includes
    a pre-stage optical path to which the output light emitted from the semiconductor laser is input; and a j-th branch optical path (where j=1 to m, and m is a positive integer not less than 2) into which the pre-stage optical path is branched, and
    the first light feedback element and the i-th light feedback element (i=2 to n) are arranged on either one of the pre-stage optical path and the j-th branch optical path (j=1 to m).

13. A semiconductor laser device comprising:
    a semiconductor laser having a front facet from which an output light is emitted;
    a first light feedback element arranged at an optical distance L1 from the front facet on an optical path of the output light, the first light feedback element having a predetermined reflection center wavelength and configured to feed a part of the output light back to the semiconductor laser; and
    an i-th light feedback element among (n−1) light feedback elements, each arranged at an optical distance Li from the front facet on the optical path of the output light (where i=2 to n, n is a positive integer not less than 2, and Li>L1), the i-th light feedback element each having a reflection center wavelength substantially equal to the reflection center wavelength of the first light feedback element and configured to feed a part of the output light back to the semiconductor laser, wherein
    the optical path includes a pre-stage optical path to which the output light emitted from the semiconductor laser is input; and a j-th branch optical path (where j=1 to m, and m is a positive integer not less than 2) into which the pre-stage optical path is branched, the first light feedback element and the i-th light feedback element (i=2 to n) are arranged on either one of the pre-stage optical path and the j-th branch optical path (j=1 to m), an optical distance between adjacent light feedback elements among the (n−1) light feedback elements is not smaller than 50 cm, and L1 and Li satisfies $$((M-1)+0.01)<(Li/L1)<(M-0.01)$$

where M is a positive integer not less than 2, satisfying $$(M-1)<(Li/L1)\leq M.$$

14. The semiconductor laser device according to claim 13, wherein Li/L1 is not less than 4.01.

15. The semiconductor laser device according to claim 13, further comprising:
a post-stage optical path that includes an polarization combiner configured to orthogonally polarization-combine lights from m lines of the j-th branch optical path, and outputs a combined light.

16. The semiconductor laser device according to claim 13, further comprising:
an optical fiber that includes the optical path to which the output light emitted from the semiconductor laser is input and through which the output light propagates, wherein
the first light feedback element and the i-th light feedback element (i=2 to n) are fiber Bragg gratings formed in the optical fiber.

17. The semiconductor laser device according to claim 13, wherein a wavelength of the output light is within 1480 nm band.

18. A semiconductor laser device comprising:
a semiconductor laser having a front facet from which an output light is emitted;
a first light feedback element arranged at an optical distance L1 from the front facet on an optical path of the output light, the first light feedback element having a predetermined reflection center wavelength and configured to feed a part of the output light back to the semiconductor laser; and
an i-th light feedback element among (n−1) feedback elements, each arranged at an optical distance Li from the front facet on the optical path of the output light (where i=2 to n, n is a positive integer not less than 2, and Li>L1), the i-th light feedback element each having a reflection center wavelength substantially equal to the reflection center wavelength of the first light feedback element and configured to feed a part of the output light back to the semiconductor laser, wherein
the optical path includes a pre-stage optical path to which the output light emitted from the semiconductor laser is input; and a j-th branch optical path (where j=1 to m, and m is a positive integer not less than 2) into which the pre-stage optical path is branched,
the first light feedback element and the i-th light feedback element (i=2 to n) are arranged on either one of the pre-stage optical path and the j-th branch optical path (j=1 to m),
an optical distance between adjacent light feedback elements among the (n−1) light feedback elements is not smaller than 50 cm, and
L1 and Li satisfies either one of (Li/L1)<(p/q−0.01) and (Li/L1)>(p/q +0.01) for all combinations of relatively prime integers p and q selected to satisfy (p+q)≦5 and p>q.

19. A semiconductor laser device comprising:
a semiconductor laser having a front facet from which an output light is emitted;
a first light feedback element arranged at an optical distance L1 from the front facet on an optical path of the output light, the first light feedback element having a predetermined reflection center wavelength and configured to feed a part of the output light back to the semiconductor laser; and
an i-th light feedback element among (n−1) light feedback element each arranged at an optical distance Li from the front facet on the optical path of the output light (where i=2 to n, n is a positive integer not less than 2, and Li>L1), the i-th light feedback element each having a reflection center wavelength substantially equal to the reflection center wavelength of the first light feedback element and configured to feed a part of the output light back to the semiconductor laser, wherein
Li/L1 is not less than 4.01, and
an optical distance between adjacent light feedback elements among the (n−1) light feedback elements is not smaller than 50 cm.

20. A semiconductor laser device comprising:
a semiconductor laser having a front facet from which an output light is emitted;
a pre-stage optical fiber to which the output light emitted from the semiconductor laser is input;
a bidirectional optical coupler that has a predetermined branching ratio, one input port of the bidirectional optical coupler being connected with an end of the pre-stage optical fiber;
an output optical fiber connected to one output port of the bidirectional optical coupler;
a fiber grating formed in the output optical fiber, the fiber grating having a predetermined reflection center wavelength; and
(n−1) light feedback elements, each arranged at an optical distance Li from the front facet on an optical path of the output light(where i=2 to n, and n is a positive integer not less than 2), wherein
another input port of the bidirectional optical coupler is optically coupled with another output port of the bidirectional optical coupler, and
an optical distance between adjacent light feedback elements among the (n−1) light feedback elements is not smaller than 50 cm.

21. A method of stabilizing an output light from a semiconductor laser, the method comprising:
feeding wavelength-selected laser light back to the semiconductor laser by arranging a first light feedback element on an optical path of the laser light,
the semiconductor laser including (n−1) light feedback elements, each arranged at an optical distance Li from a front facet on an optical path of the output light (where i=2 to n, and n is a positive integer not less than 2), and an optical distance between adjacent light feedback elements among the (n−1) light feedback elements is not smaller than 50 cm; and
splitting the laser light propagating through the optical path at a first point between the first light feedback element and the semiconductor laser and combining a split laser light with the laser light propagating through the optical path at a second point between the first point and the semiconductor laser by arranging a loop optical path optically connecting the first point and the second point.

* * * * *